(12) United States Patent
Kondo

(10) Patent No.: US 8,609,539 B2
(45) Date of Patent: Dec. 17, 2013

(54) EMBEDDED SEMICONDUCTOR DEVICE SUBSTRATE AND PRODUCTION METHOD THEREOF

(71) Applicant: Canon Kabushiki Kaisha, Tokyo (JP)

(72) Inventor: Hiroshi Kondo, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/748,657

(22) Filed: Jan. 24, 2013

(65) Prior Publication Data

US 2013/0130494 A1    May 23, 2013

Related U.S. Application Data

(62) Division of application No. 11/555,760, filed on Nov. 2, 2006, now abandoned.

(30) Foreign Application Priority Data

Nov. 2, 2005  (JP) ................................. 2005-318962
Oct. 26, 2006  (JP) ................................. 2006-291272

(51) Int. Cl.
*H01L 21/443*    (2006.01)

(52) U.S. Cl.
USPC ........................................ 438/669; 438/614

(58) Field of Classification Search
USPC ........................................ 438/125, 669, 614
See application file for complete search history.

(56) References Cited

U.S. PATENT DOCUMENTS

| | | | |
|---|---|---|---|
| 3,903,590 A | 9/1975 | Yokogawa | 29/577 |
| 4,754,319 A | 6/1988 | Saito et al. | 357/72 |
| 4,997,791 A | 3/1991 | Ohuchi et al. | 437/209 |
| 5,548,091 A | 8/1996 | DiStefano et al. | 174/260 |
| 5,875,100 A * | 2/1999 | Yamashita | 361/764 |
| 6,239,983 B1 | 5/2001 | Shingai et al. | 361/768 |
| 6,873,060 B2 | 3/2005 | Blaszczak et al. | 257/787 |

(Continued)

FOREIGN PATENT DOCUMENTS

| | | |
|---|---|---|
| EP | 1418616 | 5/2004 |
| EP | 1441389 | 7/2004 |

(Continued)

OTHER PUBLICATIONS

Office Action dated Mar. 27, 2012, issued in counterpart Japanese Patent Application No. 2006-291272, with translation.

*Primary Examiner* — David Vu
*Assistant Examiner* — Earl Taylor
(74) *Attorney, Agent, or Firm* — Fitzpatrick, Cella, Harper & Scinto

(57) ABSTRACT

An embedded semiconductor device substrate having a semiconductor device integrated therein is formed by disposing a semiconductor device in an opening provided on an insulating resin, and sandwiching the semiconductor device and the insulating resin with a front surface wiring layer and a rear surface wiring layer and performing heat pressing. Connection between bumps of the semiconductor device and the front surface wiring layer is made with a connection wiring pattern. The connection wiring pattern is formed by patterning a resist film by direct exposure thereof with a light beam, and then performing etching. Thereby, it becomes possible to absorb a mounting error of a semiconductor device to a printed wiring board and a positional error of electrodes between semiconductor devices accompanying the tendency of reduction of the pitch of a semiconductor device, and to perform electric connection with a wiring pattern securely.

7 Claims, 10 Drawing Sheets

(56) References Cited

U.S. PATENT DOCUMENTS

| | | | |
|---|---|---|---|
| 6,909,054 B2 | 6/2005 | Sakamoto et al. | 174/260 |
| 6,933,604 B2 | 8/2005 | Sakamoto et al. | 257/720 |
| 7,122,901 B2 | 10/2006 | Sunohara et al. | 257/758 |
| 7,157,789 B2 | 1/2007 | Hirano et al. | 257/659 |
| 7,223,639 B2 | 5/2007 | Blaszczak et al. | 438/127 |
| 7,285,728 B2 | 10/2007 | Sunohara et al. | 174/260 |
| 7,420,128 B2 | 9/2008 | Sunohara et al. | 174/260 |
| 7,435,910 B2 | 10/2008 | Sakamoto et al. | 174/260 |
| 7,521,283 B2 | 4/2009 | Machida et al. | 438/106 |
| 7,563,650 B2 | 7/2009 | Nishikawa | 438/125 |
| 7,566,584 B2 | 7/2009 | Ito | 438/106 |
| 7,727,802 B2 | 6/2010 | Sunohara et al. | 438/107 |
| 7,855,342 B2 | 12/2010 | Sakamoto et al. | 174/260 |
| 2002/0041021 A1 | 4/2002 | Sakamoto et al. | 257/690 |
| 2004/0113260 A1 | 6/2004 | Sunohara et al. | 257/698 |
| 2004/0130013 A1 | 7/2004 | Sunohara et al. | 257/678 |
| 2004/0159933 A1 | 8/2004 | Sunohara et al. | 257/700 |
| 2005/0067721 A1 | 3/2005 | Blaszczak et al. | 257/787 |
| 2005/0211465 A1 | 9/2005 | Sunohara et al. | 174/260 |
| 2005/0230835 A1 | 10/2005 | Sunohara et al. | 257/758 |
| 2005/0263860 A1 | 12/2005 | Hirano et al. | 257/659 |
| 2005/0269698 A1* | 12/2005 | Okada et al. | 257/737 |
| 2006/0003495 A1 | 1/2006 | Sunohara et al. | 438/124 |
| 2006/0021791 A1 | 2/2006 | Sunohara et al. | 174/255 |
| 2006/0040463 A1 | 2/2006 | Sunohara | 438/424 |
| 2006/0121718 A1 | 6/2006 | Machida et al. | 438/612 |
| 2006/0170098 A1* | 8/2006 | Hsu | 257/723 |
| 2006/0216854 A1 | 9/2006 | Nishikawa | 438/106 |

FOREIGN PATENT DOCUMENTS

| | | |
|---|---|---|
| EP | 1447850 | 8/2004 |
| JP | 04-350951 | 12/1992 |
| JP | H09-321408 | 12/1997 |
| JP | 2001-291797 | 10/2001 |
| JP | 2004-335641 | 11/2004 |

* cited by examiner

EMBEDDED SEMICONDUCTOR DEVICE SUBSTRATE AND PRODUCTION METHOD THEREOF

RELATED APPLICATIONS

The present application is a divisional of application Ser. No. 11/555,760, filed Nov. 2, 2006. The present application claims benefit of that application under 35 U.S.C. §120, and claims priority benefit under 35 U.S.C. §119 of Japanese Patent Applications Nos. 2005-318962, filed on Nov. 2, 2005, and 2006-291272, filed on Oct. 26, 2006. The entire contents of each of the mentioned prior applications are incorporated herein by reference.

BACKGROUND OF THE INVENTION

1. Field of the Invention

The present invention relates to an embedded semiconductor device substrate having a semiconductor device buried in an insulating resin layer of a printed wiring board, and a method of producing the same.

2. Description of the Related Art

In recent years, the semiconductor package having a semiconductor device mounted therein has been continuously reduced in size and weight. Therefore, there has been increasing adopted a structure in which an electrode portion of a semiconductor package is formed into an area array, such as BGA (Ball Grid Array) and CSP (Chip Scale Package).

Furthermore, not only a two-dimensional size reduction such as the BGA and CSP, but also a multi chip package in which a plurality of semiconductor devices are stacked in a single package has been proposed such as disclosed in Japanese Patent Application Laid-Open No. H11-3970.

On the other hand, in addition to such size reduction of semiconductor packages, an embedded semiconductor device substrate having a semiconductor device buried inside of a printed wiring board has been proposed such as disclosed in Japanese Patent Application Laid-Open No. H09-321408. In the embedded semiconductor device substrate disclosed in Japanese Patent Application Laid-Open No. H09-321408, a semiconductor device having stud bumps formed thereon is mounted in a recessed portion formed beforehand on a printed wiring board, and an insulating layer is then formed so as to cover the semiconductor device.

However, in the embedded semiconductor device substrate described in Japanese Patent Application Laid-Open No. H09-321408, since a routering is necessary for forming a recessed portion in a printed wiring board, which increases the processing time remarkably. In addition, in order to bury a semiconductor device, it is necessary to form a holding surface for holding the semiconductor device at a bottom of the recessed portion, and an insulating layer is needed for the holding surface. In consequence, the thickness of the embedded semiconductor device substrate having the semiconductor device varied therein becomes very large, which makes the size reduction difficult.

So, there has been proposed a method which does not form a recessed portion beforehand in a printed wiring board but buries a semiconductor device during production of a printed wiring board to thereby produce an embedded semiconductor device substrate, in Japanese Patent Application Laid-Open No. 2004-335641. The production method disclosed therein will be explained with reference to FIGS. 10A to 10F.

First, as shown in FIG. 10A, a semiconductor device 101 is mounted through an insulating epoxy resin 104 on a Cu foil 103. Next, as shown in FIG. 10B, a prepreg material 105 is disposed at such a location that an opening 105a of the prepreg materiel 105 contains the semiconductor device 101. The prepreg material 105 has approximately the same thickness as the thickness of the semiconductor device 101, and the opening 105a having a shape corresponding to the shape of the semiconductor device 101 is formed with a punching press. In addition, on the prepreg material 105, there is put an RCC (Resin Coated Cupper) material 107 having an epoxy resin 106 as an insulating resin coated on a Cu foil 103a. The Cu foil 103, prepreg material 105, and RCC material 107 (epoxy resin 106/cupper foil 103a) are disposed by stacking in this way, and are subjected to thermocompression bonding in a vacuum atmosphere as shown in FIG. 10C.

Next, as shown in FIG. 10D, a part of the Cu foil 103a corresponding to an electrode portion 102 on the semiconductor device 101 is removed by ordinary etching to form a hole portion. Then, a part of the epoxy resin 106 which is exposed via the hole portion is removed by a laser such as a $CO_2$, YAG, or excimer laser to form an opening 108, whereby the electrode portion 102 of the semiconductor device 101 is exposed therethrough. Next, as shown in FIG. 12E, while a Cu layer 103b is formed on the entire surface by plating, the opening 108 is filled with the Cu layer 103b.

Subsequently, a resist material is coated on the Cu layer 103b, and a wiring pattern is formed in an exposure step through a mask and a development step, so that the embedded semiconductor device substrate having the semiconductor device 101 integrated therein as shown in FIG. 10F is obtained.

In the embedded semiconductor device substrate disclosed in Japanese Patent Application Laid-Open No. 2004-335641 above, by forming an opening accurately by use of a laser, electrodes of a semiconductor device are exposed outside. Furthermore, by etching a Cu layer formed on a printed wiring board by use of a mask, a wiring pattern connected to the electrodes is formed. Hence, there is required an etching accuracy of such an extent as to surely connect the electrodes of the semiconductor device and the wiring pattern on the printed wiring board to each other.

On the other hand, since a large number of semiconductor devices are produced from a single semiconductor wafer, there are differences between individual semiconductor devices obtained therefrom, and there are positional errors between the individual semiconductor devices also with regard to electrode positions. Furthermore, there will be necessarily generated a mounting error within a predetermined range in the mounting position of a semiconductor device to a printed wiring board. Therefore, there is generated a displacement with respect to a design position between the patterning position of a wiring pattern, and the position of an electrode of a semiconductor device. Generally, in prospect of this displacement, the patterning using a mask is made so as to provide a pattern shape with a predetermined amount of margin.

Nevertheless, as the pitch of electrodes of a semiconductor device is reduced, it becomes impossible to take a sufficient margin to avoid interference with an adjacent wiring pattern. That is, it becomes difficult to allow the above described errors when mounting semiconductor devices to a printed wiring board and positional errors of electrodes between individual semiconductor devices, by means of a margin of a pattern shape. Thereby, the electrodes of the semiconductor devices and the wiring on the printed wiring board will not be connected. Such a situation becomes significant as the pitch between electrodes of a semiconductor device is reduced, and it is believed that it will become a more serious problem in the future.

SUMMARY OF THE INVENTION

Therefore, the present invention has been accomplished in view of such problems, and it is an object of the present invention to provide an embedded semiconductor device substrate, which can increase the stability of electric connection to a wiring pattern, corresponding to the tendency of reduction in pitch of an electrode portion of a semiconductor device, and a method of producing the same.

According to a first aspect of the present invention, there is provided an embedded semiconductor device substrate having a semiconductor device integrated in an insulating resin layer, wherein a wiring pattern is formed on the insulating resin layer, a bump for connection is formed on an electrode portion on the semiconductor device, and the wiring pattern and the bump are connected through a connection wiring pattern provided on the wiring pattern and the bump.

In the present invention, it is preferred that the connection wiring pattern is thinner than the wiring pattern.

Further, it is preferred that the wiring has a multi-layer structure which is comprised of a plurality of materials.

According to a second aspect of the present invention, there is provided a method of producing an embedded semiconductor device substrate having a semiconductor device integrated therein, comprising the steps of: forming a bump on an electrode portion on a surface of a semiconductor device; disposing the semiconductor device in an opening formed on a substrate; forming a conductive film on the semiconductor device and the substrate; integrating the semiconductor device and the substrate into a single body; patterning the conductive film to form wiring patterns and removing the conductive film on the semiconductor device to expose the bump; and forming a connection wiring pattern for connecting the electrode portion on the semiconductor device and the wiring pattern.

In the present invention, it is preferred that the connection wiring pattern is formed by forming a connection wiring layer on the insulating resin layer and the semiconductor device, patterning a resist material formed on the connection wiring layer by performing direct exposure with a laser, and then performing etching.

Further, it is preferred that the connection wiring pattern is formed by forming a connection wiring layer on the insulating resin layer and the semiconductor device, performing direct writing of a resist material on the connection wiring layer, and then performing etching.

Moreover, it is preferred that the connection wiring pattern is formed by performing direct writing of a conductive material on the insulating resin layer and the semiconductor device.

The above and other objects of the Invention will become more apparent from the following drawings taken in conjunction with the accompanying drawings.

DESCRIPTION OF THE EMBODIMENTS

Embodiments of the present invention will be explained.

EXAMPLE 1

Figure 1:
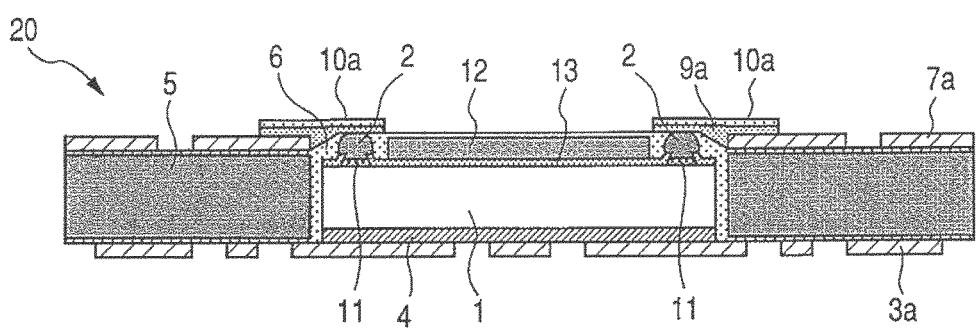
FIG. 1 is a cross-sectional view of an embedded semiconductor device substrate according to Example 1 of the present invention.

FIG. 1 is a cross-sectional view of an embedded semiconductor device substrate 20 according to Example 1 of the present invention. In the figure, reference numeral 1 denotes a semiconductor device, and reference numeral 2 denotes a bump formed on an electrode portion 11 on the semiconductor device 1. Portions other than the electrode portion 11 on the semiconductor device 1 are covered with an insulating layer 13. Reference numeral 12 denotes a resin film provided on the insulating layer 13 and having a thickness which is approximately the same as the height of the bump 2. An insulating layer 4 is provided under the semiconductor device 1. Reference numeral 5 denotes an insulating resin layer which forms a body of a printed wiring board. Reference symbol 3a denotes a rear surface wiring pattern formed on a rear surface of the insulating resin layer 5, and reference symbol 7a denotes a front surface wiring pattern formed on a front surface of the insulating resin layer 5. Reference numeral 6 denotes an adhesive resin layer which seals the semiconductor device 1. Reference symbol 10a denotes a connection wiring pattern which connects the front surface wiring pattern 7a on the insulating resin layer 5 and the bump 2 on the semiconductor device 1. The connection wiring pattern 10a connects the bump 2 and the front surface wiring pattern 7a through a conductive protective layer 9a.

(Production Method 1)

Figure 2A:
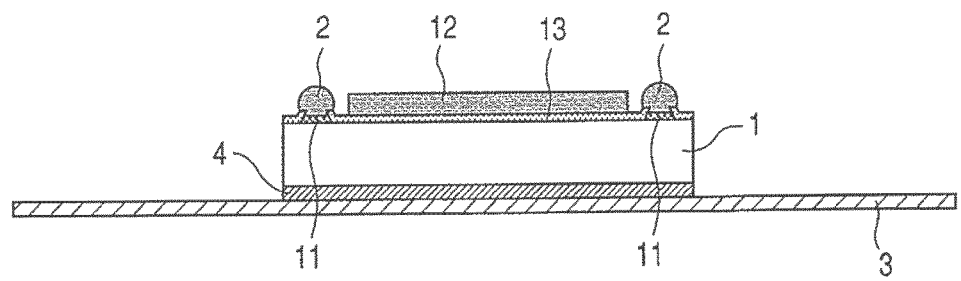
FIGS. 2A, 2B, and 2C are cross-sectional views illustrating the steps of Production Method 1 of a semiconductor substrate according to Example 1 of the present invention.

Next, a first method of producing the embedded semiconductor device substrate 20 shown in FIG. 1 will be explained with reference to FIGS. 2A to 4C. Firstly, as shown in FIG. 2A, bumps 2 are formed on the electrode portion 11 on an upper surface of the semiconductor device 1. For the bumps 2, a metal such as Au or Cu or a solder is used. As to the shape thereof, a sphere or cylinder with a diameter of 20 to 30 µm is used. The upper surface of the semiconductor device 1 is covered with the insulating layer 13, and only the electrode portion 11 is exposed to the upper surface. An epoxy resin or the like can be used as the insulating layer 13. Further, the resin film 12 having a thickness which is approximately the same as the height of the bump 2 is formed in an active area of the upper surface of the insulating layer 13 formed on the upper surface of the semiconductor device 1. A polyimide film or the like can be used as the resin film 12.

Next, the semiconductor device 1 having the bumps 2 and the resin film 12 formed on the surface thereof, and the rear surface wiring layer 3 are bonded through the insulating layer 4. As the insulating layer 4, there is used an epoxy resin film of 10 to 50 μm in thickness or the like. As the rear surface wiring layer 3, it is possible to use a thin film such as of copper or aluminum of 10 to 35 μm in thickness. The semiconductor device 1 is bonded to the rear surface wiring layer 3 through the insulating layer 4 by heat curing.

Figure 2B:
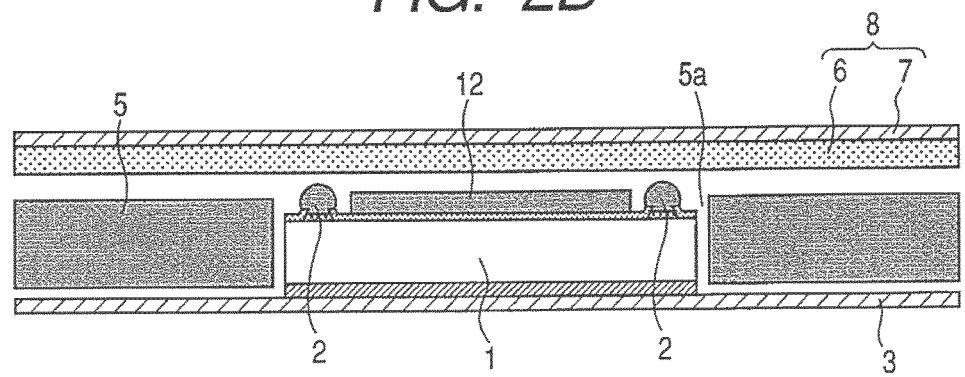

Subsequently, as shown in FIG. 2B, the insulating resin layer 5 which has approximately the same thickness as the thickness (50 to 150 μm) of the semiconductor device 1, and has the opening 5a with a shape corresponding to the shape of the semiconductor device 1 is disposed at such a location that the opening 5a contains the semiconductor device 1. As the insulating resin layer 5, a prepreg material containing glass cloth can be used. The semiconductor device 1 is disposed in the opening 5a of the insulating resin layer 5.

In addition, on the insulating resin layer 5 and semiconductor device 1, an RCC material 8 having the adhesive resin layer 6 such as of an epoxy lined on the front surface wiring layer 7 is disposed. As the front surface wiring layer 7, similarly to the rear surface wiring layer 3, it is possible to use a thin film such as of copper or aluminum of 10 to 35 μm in thickness. As the adhesive resin layer 6, an epoxy resin film with a thickness of 20 to 60 μm or the like can be used.

Figure 2C:
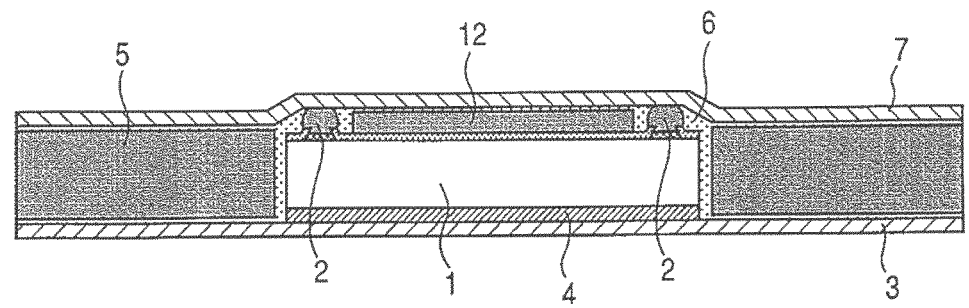

Next, as shown in FIG. 2C, the rear surface wiring layer 3, the insulating resin layer 5, and the RCC material 8 are simultaneously subjected to heat pressing at a temperature of 150 to 200° C. in a vacuum atmosphere. Thereby, the rear surface wiring layer 3, the insulating resin layer 5, and the RCC material 8 are integrated into a single substrate. Since the flowability of the adhesive resin layer 6 becomes high by the heating, the adhesive resin is flown to enter a gap between the semiconductor device 1 in the opening 5a and the insulating resin layer 5 to fix the semiconductor device 1 securely. In addition, since the adhesive resin layer 6 on the bumps 2 is flown away by the bumps, the bumps 2 and the front surface wiring layer 7 come into contact with each other.

At this time, the reason why the prepreg material 5 containing glass cloth is used is to prevent the flatness of the surface after the heat pressing from being impaired due to a difference in pressure between a portion where the semiconductor device 1 exists and a portion where no semiconductor device exists generated by the pressure applied during the heat pressing. Also from this viewpoint, it is preferable that the thickness of the glass cloth is equal to or somewhat larger than the sum of the thickness of the semiconductor device 1 and the height of the bump 2.

In addition, the above-mentioned resin film 12 prevents the front surface wiring layer 7 on the semiconductor device 1 from becoming uneven (non-flat) due to the bumps 2 provided on the semiconductor device 1. Furthermore, when the bumps 2 deform to reduce their heights to the thickness of the resin film 12, the resin film 12 also receives the applied pressure, so that it is possible to prevent the semiconductor device 1 from being damaged by concentration of the pressing pressure on the bumps 2.

Figure 3A:
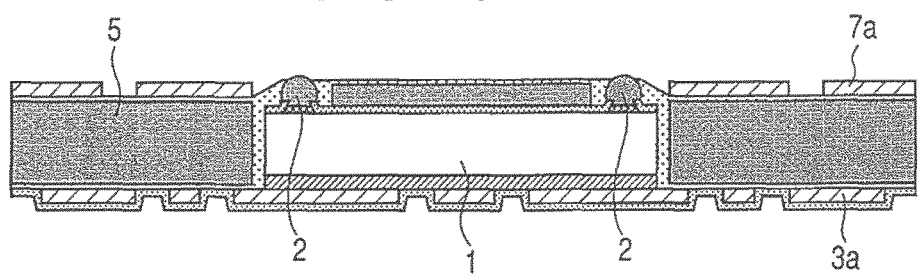
FIGS. 3A and 3B are cross-sectional views illustrating the steps of Production Method 1 of the semiconductor substrate according to Example 1 of the present invention.

Next, as shown in FIG. 3A, the front surface wiring layer 7 and the rear surface wiring layer 3 of the integrated substrate are patterned to form the front surface wiring pattern 7a and the rear surface wiring pattern 3a. Thereby, the top portions of the bumps 2 are exposed.

Figure 3B:
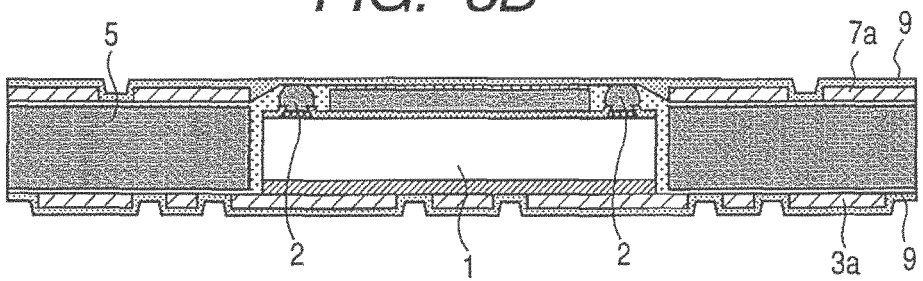

Subsequently, as shown in FIG. 3B, a protective layer 9 of 1 to 3 μm thick is formed on the front and the rear surfaces of the substrate by electroless plating. As the protective layer 9, a metal such as Ni can be used. The protective layer 9 plays roles of protecting the thus formed wiring pattern 7a and of preventing diffusion between the bumps 2 of the semiconductor device 1 and the connection wiring pattern 10a described later.

Figure 4A:
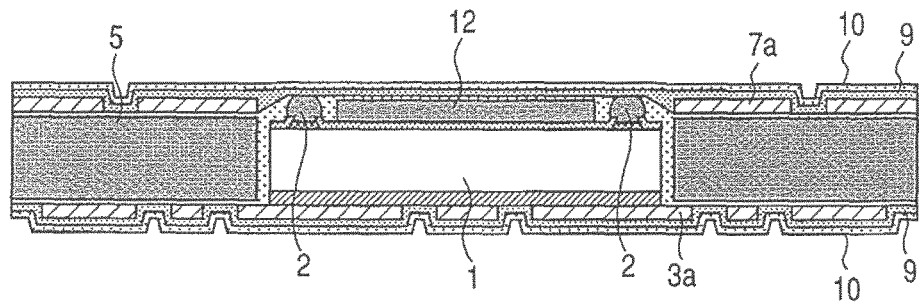
FIGS. 4A, 4B, and 4C are cross-sectional views illustrating the steps of Production Method 1 of the semiconductor substrate according to Example 1 of the present invention.

Next, as shown in FIG. 4A, a connection wiring layer 10 of 1 to 3 μm thick is formed on the protective layer 9 by plating. A metal such as Cu can be used for the connection wiring layer 10.

Figure 4B:
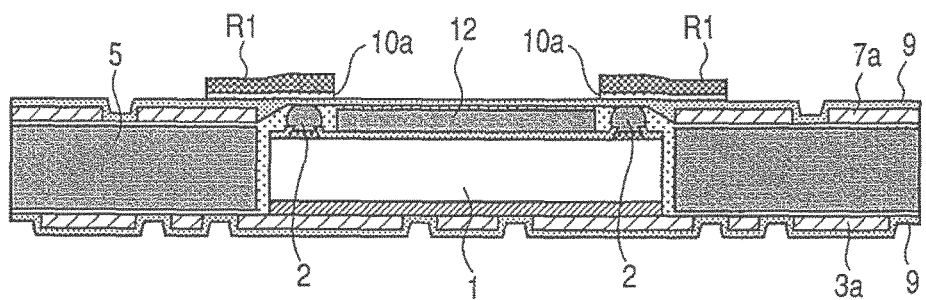

Subsequently, the positions of the bumps 2 and the front surface wiring pattern 7a are confirmed, and a resist R1 is formed in alignment with those positions, as shown in FIG. 4B. Specifically, a negative resist layer is provided on the surface on the side of which the bumps 2 of the semiconductor device 1 are exposed, and the positions of the respective bumps 2 are detected with respect to the individual semiconductor devices. After that, direct exposure with a light beam is performed to an area ranging from the region where the bump 2 is exposed to the electrode portion of the wiring pattern 7a to be connected. As the light beam, any light may be used as long as it has a wavelength band in which the resist material is photosensitive, with UV light being generally used. In addition, as a method of performing direct exposure, it is possible to provide an X-Y driving unit on a beam head, or to provide an X-Y driving unit on a stage for holding the substrate and perform driving as programmed.

Incidentally, the resist pattern R1 can be formed, not only by forming once a resist film on the entire surface and then performing direct writing with a laser as described above, but also by performing direct writing of a resist itself. By performing direct writing of the resist itself, it becomes possible to reduce the production steps.

Next, by performing exposure followed by development for the respective semiconductor devices 1, the resist pattern R1 is formed only on portions from the bumps 2 of the semiconductor device 1 to the electrode portion of the wiring pattern 7a. In this state, when the connection wiring pattern layer 10 is etched with a persulfuric acid solution, a portion of the connection wiring pattern layer (Cu layer) 10 on the protective layer (Ni layer) 9 other than the portion covered with the resist pattern R1 is removed. Thereby, the connection wiring pattern layer 10 is patterned to provide the connection wiring pattern 10a. At this time, the etching conditions are adjusted so that the etchant does not etch the protective layer (Ni layer) 9.

Subsequently, in the state in which the resist pattern R1 remains, the protective layer (Ni layer) 9 is etched. At this time, a ferric chloride based solution is used as an etchant. Although the ferric chloride based solution also etches the connection wiring pattern 10a, since the connection wiring pattern 10a is far thicker than the protective layer 9, the connection wiring pattern will not be disconnected. In particular, in the case of a very thin connection wiring pattern 10a, it is possible to perform stable pattern formation since the Cu and the resist exist on the Ni.

Figure 4C:
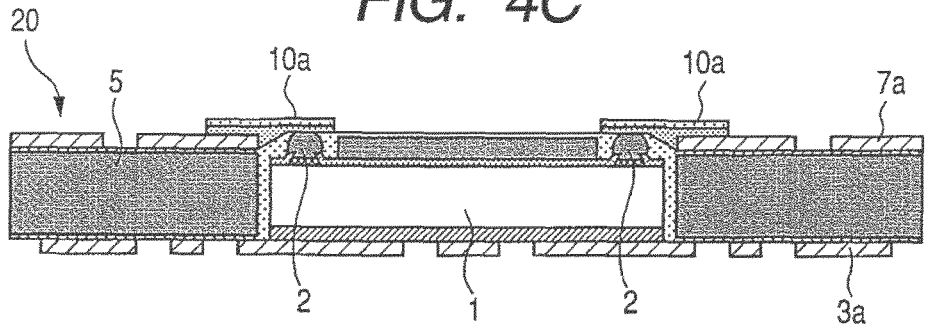

Then, by stripping the resist pattern R1, as shown in FIG. 4C, the embedded semiconductor device substrate 20 can be obtained.

Figure 5A:
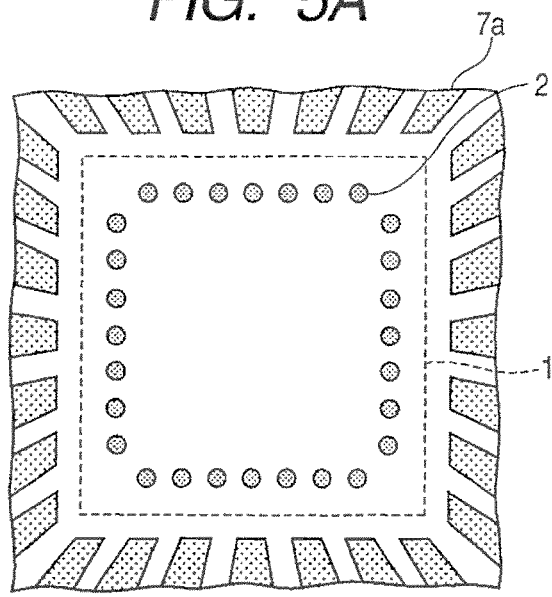
FIGS. 5A and 5B are plan views illustrating the arrangement of bumps of a semiconductor device and a connection wiring pattern according to Example 1 of the present invention.
Figure 5B:
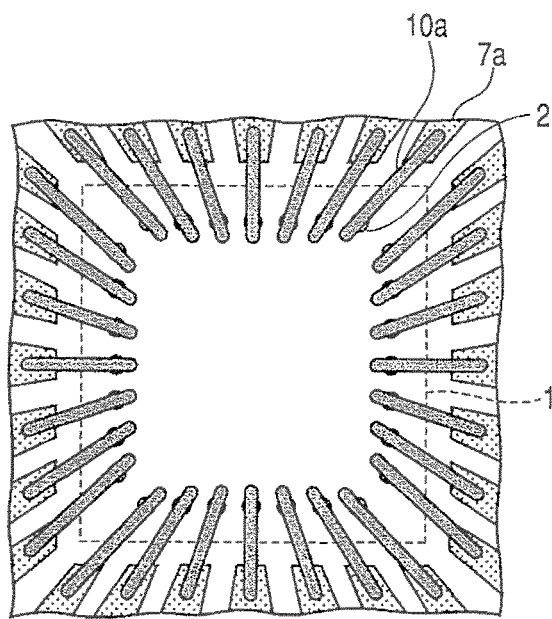
Figure 6A:
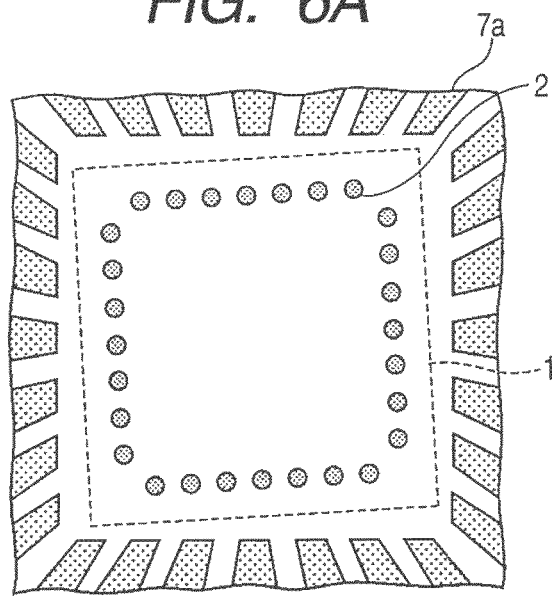
FIGS. 6A and 6B are plan views illustrating the arrangement of bumps of a semiconductor device and a connection wiring pattern according to Example 1 of the present invention.
Figure 6B:
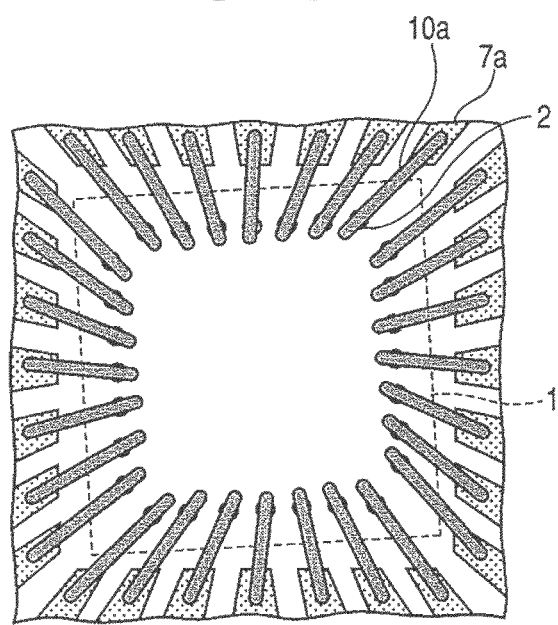

FIGS. 5A, 5B, 6A and 6B are plan views of the embedded semiconductor device substrate 20 showing the connection wiring pattern 10a which connects the bumps 2 and the wiring pattern 7a. FIGS. 5A and 6A are views showing the state before forming the connection wiring pattern 10a, and FIGS. 5B and 6B are views showing the state after forming the connection wiring pattern 10a. With respect to FIGS. 5A and 5B, in FIGS. 6A and 6B the semiconductor device 1 is disposed obliquely. In this example, in the step of forming the resist R1 shown in FIG. 4B mentioned above, writing of the resist with a beam is performed while positions ranging from the bumps 2 of the semiconductor device 1 to the connecting portions of the wiring pattern 7a are corrected automatically. Hence, even if the positional relationship between the bumps 3 of the semiconductor device 1 and the front surface wiring pattern 7a deviates somewhat from the adequate one, it is possible to attain always stable connection.

According to the present invention, a process of forming the wiring pattern 7a and a process of forming the connection wiring pattern 10a are separated from each other. Thereby, it becomes possible to form the resist, when forming the connection wiring pattern 10a, so as to be in alignment with the positions of the electrodes of the individual semiconductor devices. Thereby, even if the positions of the semiconductor devices are deviated from the adequate ones, since it is possible to attend thereto by correcting the writing program, it is possible to form easily such an extremely fine connection wiring pattern 10a having dimensions of wiring width/space=10 μm/10 μm to 20 μm/20 μm.

(Production Method 2)

Next, a second method of producing the embedded semiconductor device substrate 20 shown in FIG. 1 will be explained with reference to FIGS. 7A to 7C. In the second production method, a positive resist R2 is used instead of the negative resist R1 used in the first production method. In the second production method, the steps of the first production method described with reference to FIGS. 2A to 3B are similarly carried out as such, and then the steps shown in FIGS. 7A to 7C are carried out instead of the steps shown in FIGS. 4A to 4C.

Figure 7A:
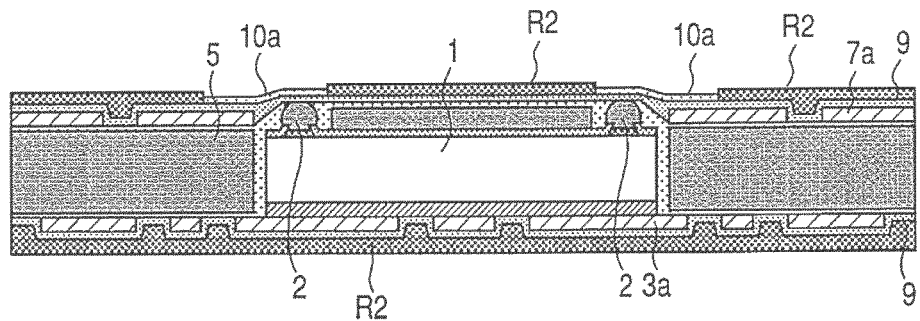
FIGS. 7A, 7B, and 7C are cross-sectional views illustrating the steps of Production Method 2 of the semiconductor substrate according to Example 1 of the present invention.

As shown in FIG. 7A, a positive resist R2 is formed so that only portions of the protective layer (Ni layer) 9 in which the connection wiring pattern 10a is to be formed is exposed. Then, electroplating is performed by using the protective layer 9 as a common electrode layer to form the connection wiring pattern (Cu layer) 10a. The thickness of the connection wiring pattern (Cu layer) 10a is preferably 5 to 15 μm.

Figure 7B:
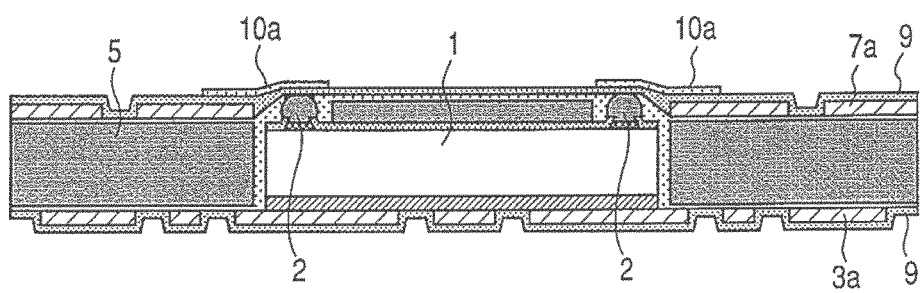
Figure 7C:
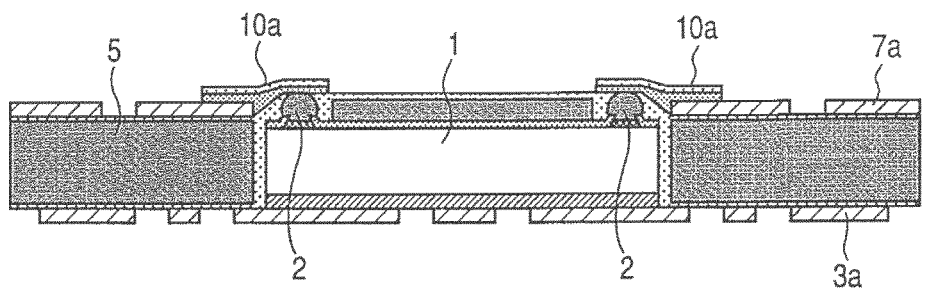

Next, as shown in FIG. 7B, the resist pattern R2 is stripped, and as shown in FIG. 7C, the protective layer 9 is etched. At that time, although the connection wiring pattern 10a is also etched, since the film thickness thereof is larger than that of the protective layer 9, the film thickness becomes about 3 to 10 μm when etching is completed. Incidentally, the resist pattern R2 can be formed also by performing direct writing of a resist itself as is the case with the above-mentioned resist pattern R1. By performing direct writing of the resist itself, it becomes possible to reduce the production steps.

EXAMPLE 2

Figure 8:
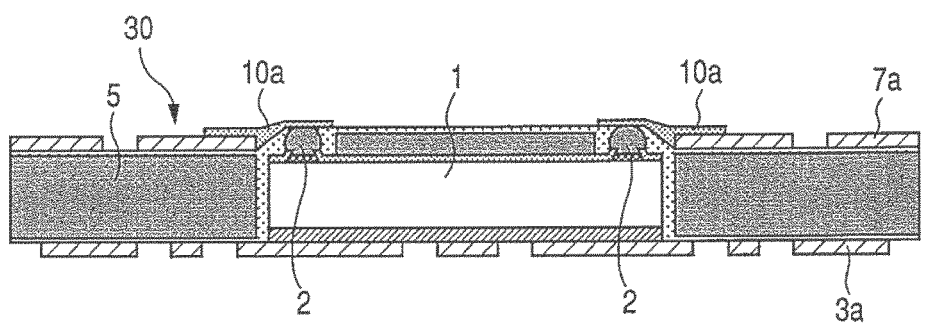
FIG. 8 is a cross-sectional view of an embedded semiconductor device substrate according to Example 2 of the present invention.

FIG. 8 is a cross-sectional view of an embedded semiconductor device substrate 30 according to Example 2 of the present invention. In comparison with the embedded semiconductor device substrate 20 of Example 1 shown in FIG. 1, this example has such a structure that there is no protective layer 9. In this example, the material of the bumps 2 of the semiconductor device 1 is Ni. In this case, it is not necessary to provide the protective layer 9 which functions as a diffusion barrier layer between the bumps 2 and the wiring pattern 7a. Incidentally, in FIG. 8, the elements which are the same as those shown in FIG. 1 are identified by like reference numerals or symbols.

Next, the method of producing the embedded semiconductor device substrate 30 shown in FIG. 8 will be explained with reference to FIGS. 9A and 9B. In the production method of this example, the steps of the first production method described with reference to FIGS. 2A to 3B are similarly carried out as such, and then the steps shown in FIGS. 9A and 9B are carried out instead of the steps shown in FIGS. 4A to 4C.

Figure 9A:
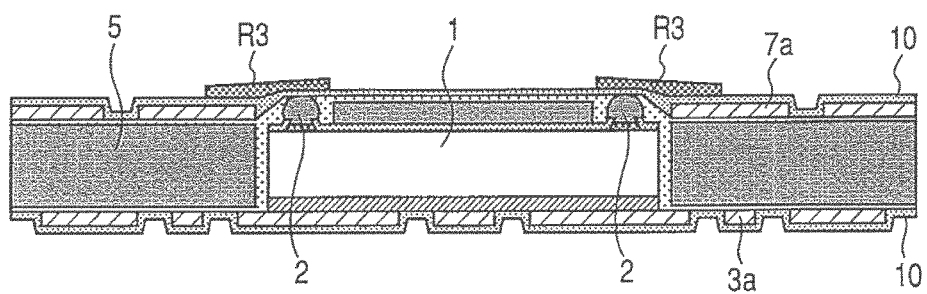
FIGS. 9A and 9B are cross-sectional views illustrating the steps of a production method of a semiconductor substrate according to Example 2 of the present invention.
Figure 9B:
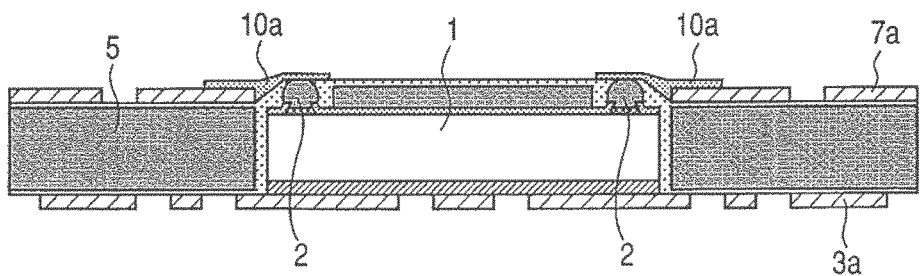
Figure 10A:
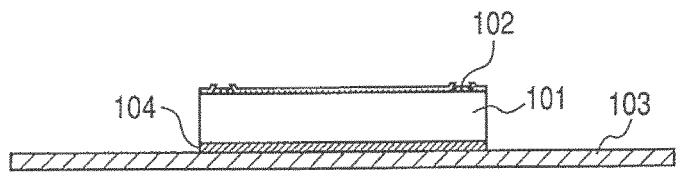
FIGS. 10A, 10B, 10C, 10D, 10E, and 10F are cross-sectional views illustrating the steps of a production method of a semiconductor substrate according to a conventional example.
Figure 10B:
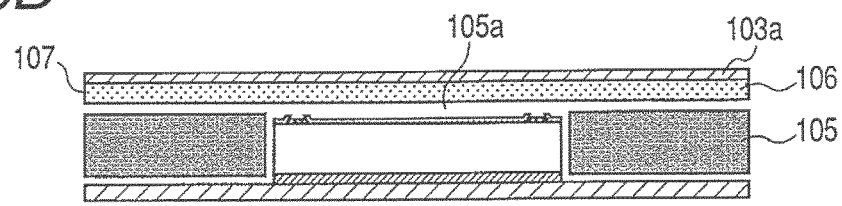
Figure 10C:
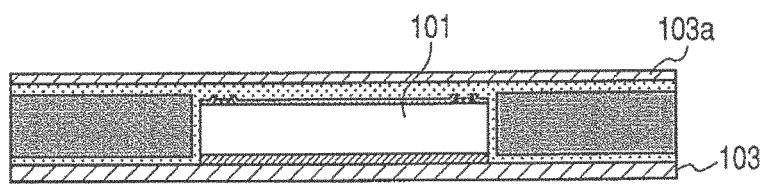
Figure 10D:
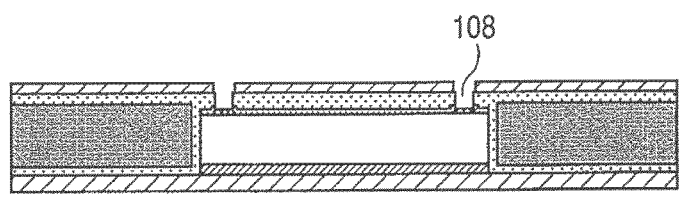
Figure 10E:
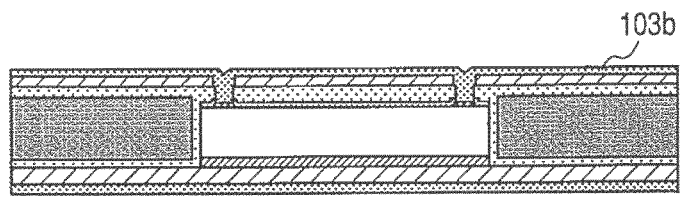
Figure 10F:
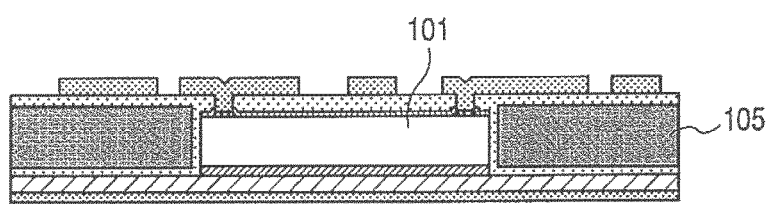

As shown in FIG. 9A, after forming the wiring patterns 3a and 7a, the connection wiring pattern layer (Cu layer) 10 is formed on the entire surface in a thickness of 3 to 10 μm by electroless plating. Then, the connection wiring pattern layer 10 is etched using a negative resist pattern R3 to form the connection wiring pattern 10a which is a very thin pattern as shown in FIG. 9B.

Incidentally, although in this example the bumps 2 are made of Ni and the connection wiring pattern 10a is made of Cu, the bumps 2 may be made of Cu and the connection wiring pattern 10a may be made of Ni. Furthermore, the bumps 2 may be made of Ni and the connection wiring pattern 10a may also be made of Ni, or the bumps 2 may be made of Cu and the connection wiring pattern 10a may also be made of Cu.

Incidentally, the resist pattern R3 can be formed also by performing direct writing of a resist itself as is the case with the above-mentioned resist pattern R1. By performing direct writing of the resist itself, it becomes possible to reduce the production steps.

Furthermore, it is also possible to perform direct writing of the connection wiring pattern 10a instead of the resist. Thereby, it is possible to omit exposure and development process after writing of a resist.

According to the present invention, in an embedded semiconductor device substrate, electrodes of a semiconductor device and a wiring pattern on a printed wiring board are connected by means of a connection wiring pattern. In addition, the connection wiring pattern is formed in a separate step after burying the semiconductor device into the printed wiring board. Thereby, it becomes possible to form the connection wiring pattern corresponding to positions of the electrodes of the semiconductor device and the patterned wiring on the printed wiring board. In addition, it becomes possible to perform electric connection with a wiring pattern securely even when the electrode portion of the semiconductor device has a narrow pitch.

Furthermore, when a semiconductor device is buried inside a substrate and a wiring pattern is formed, it becomes possible to perform post-process tests such as a burn-in test easily, so that non-defective products can be selected. Hence, even when further combined with other components or devices, it is possible to maintain a high yield and to reduce the production cost.

Moreover, since the degree of freedom of wiring design is high, it is possible to address combination with various semiconductor devices or electric circuit components flexibly. Hence, it becomes possible to provide higher-performance, small-size, and low-cost semiconductor products.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of producing an embedded semiconductor device substrate having a semiconductor device integrated therein, comprising the steps of:
    disposing a semiconductor device having a bump formed on an electrode portion on a surface of the semiconductor device, in an opening formed on a substrate;
    forming a conductive film on the semiconductor device and the substrate;
    integrating the semiconductor device and the substrate into a single body;
    patterning the conductive film to form a wiring pattern and removing the conductive film on the semiconductor device to expose the bump; and
    forming a connection wiring pattern for connecting the bump and the wiring pattern.

2. The method according to claim 1, wherein the connection wiring pattern is formed by forming a connection wiring layer on the substrate and the semiconductor device, forming a negative resist material on the connection wiring layer, patterning the resist material by performing direct exposure with a laser, and then performing etching by using the resist material as an etching mask.

3. The method according to claim 1, wherein the connection wiring pattern is formed by forming an under-layer of a connection wiring layer on the substrate and the semiconductor device, forming a positive resist material on the connection wiring layer, patterning the resist material by performing direct exposure with a laser, and then performing plating by using the resist material as a plating mask.

4. The method according to claim 1, wherein the connection wiring pattern is formed by forming a connection wiring layer on the substrate and the semiconductor device, performing direct writing of a resist material on the connection wiring layer, and then performing etching.

5. The method according to claim 1, wherein the connection wiring pattern is formed by performing direct writing of a conductive material on the substrate and the semiconductor device.

6. The method according to claim 4, wherein the substrate comprises an insulating resin layer, and the connection wiring pattern is formed by forming a connection wiring layer on the insulating resin layer and the semiconductor device, performing direct writing of a resist material on the connection wiring layer, and then performing etching.

7. The method according to claim 5, wherein the substrate comprises an insulating resin layer, and the connection wiring pattern is formed by forming a connection wiring layer on the insulating resin layer and the semiconductor device, performing direct writing of a resist material on the connection wiring layer, and then performing etching.

* * * * *